United States Patent
Kim et al.

(10) Patent No.: US 9,653,520 B2
(45) Date of Patent: May 16, 2017

(54) ORGANIC LIGHT EMITTING DISPLAY PANEL AND METHOD OF MANUFACTURING THE SAME

(71) Applicant: LG Display Co., Ltd., Seoul (KR)

(72) Inventors: Ji-Min Kim, Seoul (KR); Do-Hyung Kim, Seoul (KR); Hye-Min Oh, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/725,677

(22) Filed: May 29, 2015

(65) Prior Publication Data

US 2015/0263077 A1 Sep. 17, 2015

Related U.S. Application Data

(63) Continuation of application No. 13/677,466, filed on Nov. 15, 2012, now Pat. No. 9,062,852.

(30) Foreign Application Priority Data

Nov. 15, 2011 (KR) .......................... 10-2011-119186

(51) Int. Cl.
*H01L 27/32* (2006.01)
*H01L 51/56* (2006.01)
(Continued)

(52) U.S. Cl.
CPC ............ *H01L 27/3213* (2013.01); *F21V 9/08* (2013.01); *H01L 27/322* (2013.01);
(Continued)

(58) Field of Classification Search
None
See application file for complete search history.

(56) References Cited

U.S. PATENT DOCUMENTS 7,436,113 B2 10/2008 Spindler
7,439,670 B2 10/2008 Winters et al.
(Continued)

FOREIGN PATENT DOCUMENTS

CN 1536943 A 10/2004
CN 101212025 A 7/2008
(Continued)

OTHER PUBLICATIONS

Office Action dated Feb. 22, 2014 from the Korean Patent Office in counterpart Korean application No. 10-2011-0119186.
(Continued)

*Primary Examiner* — Phat X Cao
*Assistant Examiner* — David Goodwin
(74) *Attorney, Agent, or Firm* — Morgan Lewis & Bockius LLP

(57) ABSTRACT

An organic light emitting display panel with improved efficiency and lifespan and a method of manufacturing the same are disclosed. The organic light emitting display panel according to the present invention includes a substrate having red, green, blue, and white sub-pixel regions, red, green, and blue color filters respectively formed in the red, green, and blue sub-pixel regions, an overcoat layer that is formed in the red and green sub-pixel regions except for the blue and white sub-pixel regions or is formed in the sub-pixel regions such that a thickness of the overcoat layer in the red and green sub-pixel regions is greater than a thickness of the overcoat layer in the blue and white sub-pixel regions; and organic emitting cells respectively formed in the red, green, blue, and white sub-pixel regions.

16 Claims, 6 Drawing Sheets

(51) Int. Cl.
F21V 9/08 (2006.01)
H01L 51/52 (2006.01)

(52) U.S. Cl.
CPC ...... *H01L 27/3248* (2013.01); *H01L 27/3258* (2013.01); *H01L 27/3262* (2013.01); *H01L 51/5256* (2013.01); *H01L 51/56* (2013.01); *H01L 2227/323* (2013.01); *H01L 2251/558* (2013.01)

(56) References Cited

U.S. PATENT DOCUMENTS

| | | | |
|---|---|---|---|
| 7,602,119 | B2 | 10/2009 | Miller et al. |
| 7,855,508 | B2 | 12/2010 | Cok et al. |
| 7,859,188 | B2 | 12/2010 | Cok et al. |
| 7,903,055 | B2 | 3/2011 | Nishikawa et al. |
| 8,040,052 | B2 | 10/2011 | Kobayashi |
| 2004/0195963 | A1 | 10/2004 | Choi et al. |
| 2009/0201229 | A1* | 8/2009 | Kobayashi .......... H01L 27/3213 345/76 |
| 2010/0053043 | A1 | 3/2010 | Sakamoto |
| 2010/0053044 | A1* | 3/2010 | Lee ................... H01L 51/5259 345/80 |
| 2010/0060148 | A1 | 3/2010 | Hwang et al. |
| 2011/0062475 | A1 | 3/2011 | Cho |
| 2013/0082589 | A1* | 4/2013 | So ...................... H01L 51/5036 313/504 |
| 2013/0119857 | A1 | 5/2013 | Su et al. |

FOREIGN PATENT DOCUMENTS

| | | |
|---|---|---|
| CN | 101425529 A | 5/2009 |
| CN | 102024844 A | 4/2011 |
| JP | 2010-181715 A | 8/2010 |
| KR | 1020110063227 A | 6/2011 |
| TW | 586094 B | 5/2004 |
| TW | I255669 B | 5/2006 |
| TW | I280816 B | 5/2007 |
| TW | 201320326 A | 5/2013 |

OTHER PUBLICATIONS

The First Notification of Office Action dated Dec. 31, 2014 from the State Intellectual Property Office of China in counterpart Chinese application No. 201210460199.7.

Examination Statement dated Feb. 6, 2015 from the Taiwan Advance Patent & Trademark Office in counterpart Taiwanese application No. 101142525.

Office Action dated Jul. 14, 2016 from the Taiwan Advance Patent & Trademark Office in counterpart Taiwan Application No. 10520862600.

* cited by examiner

ORGANIC LIGHT EMITTING DISPLAY PANEL AND METHOD OF MANUFACTURING THE SAME

This application is a continuation application of copending U.S. application Ser. No. 13/677,466, filed on Nov. 15, 2012, which claims the benefit of Korean Patent Application No. 10-2011-119186, filed in the Republic of Korea on Nov. 15, 2011, both of which are hereby incorporated by reference.

BACKGROUND OF THE INVENTION

Field of the Invention

The present invention relates to an organic light emitting display panel and a method of manufacturing the same, and more particularly, to an organic light emitting display panel with improved efficiency and lifespan and a method of manufacturing the same.

Discussion of the Related Art

For an image display device which embodies a variety of information on a screen as a core technology in advanced information and communication, there is continuous progress in development of thin, lightweight, and portable devices with improved performance. Organic light emitting display devices that display an image by controlling intensity of light emitted from an organic emitting layer have drawn significant attention as flat panel display devices capable of reducing weight and volume of display devices which are drawbacks of cathode ray tubes (CRTs).

Organic light emitting display devices display an image by using pixels arranged in a matrix form, each pixel including three sub-pixels (red (R), green (g), and blue (B)). However, in a white organic light emitting display device that is one of the organic light emitting display devices, a color is realized by R, G, and B color filters formed in the white device. Due to an overcoat formed on color filters in a display including R, G, B, and W sub-pixels, transmittance of the B and W sub-pixels is reduced at a relatively high rate compared to that of the R and G sub-pixels, thereby reducing panel efficiency.

SUMMARY OF THE INVENTION

Accordingly, the present invention is directed to an organic light emitting display panel and a method of manufacturing the same that substantially obviate one or more problems due to limitations and disadvantages of the related art.

An object of the present invention is to provide an organic light emitting display panel with improved efficiency and lifespan and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display panel includes a substrate having red, green, blue, and white sub-pixel regions, red, green, and blue color filters respectively formed in the red, green, and blue sub-pixel regions, an overcoat layer that is formed in the red and green sub-pixel regions except for the blue and white sub-pixel regions or is formed in the sub-pixel regions such that a thickness of the overcoat layer in the red and green sub-pixel regions is greater than a thickness of the overcoat layer in the blue and white sub-pixel regions, and organic emitting cells respectively formed in the red, green, blue, and white sub-pixel regions.

In this regard, in the organic light emitting display panel according to a first embodiment of the present invention, the organic emitting cells formed in the red and green sub-pixel regions may be disposed on the overcoat layer. The organic emitting cell formed in the blue sub-pixel region may be disposed on the blue color filter. The organic emitting cell formed in the white sub-pixel region may be disposed on a protection layer formed to cover a thin film transistor formed on the substrate.

Here, the organic electro-luminescence display panel according to the first embodiment may further include a buffer layer between the overcoat layer and each of the organic emitting cells in the red and green sub-pixel regions except for in the blue and white sub-pixel regions, between the blue color filter and the organic emitting cell in the blue sub-pixel region, and between the protection layer and the organic emitting cell in the white sub-pixel region. The buffer layer may be formed of an inorganic insulating material such as $SiN_x$ or $SiO_x$.

In this regard, in the organic light emitting display panel according to the first embodiment, the overcoat layer formed in the red, green, and blue sub-pixel regions may be disposed on the red, green, and blue color filters, and the overcoat layer formed in the white sub-pixel region may be disposed on a protection layer formed to cover a thin film transistor formed on the substrate.

In another aspect of the present invention, a method of manufacturing an organic light emitting display panel includes forming a substrate having red, green, blue, and white sub-pixel regions, forming red, green, and blue color filters respectively in the red, green, and blue sub-pixel regions, forming an overcoat layer in the red and green sub-pixel regions except for the blue and white sub-pixel regions, and forming organic emitting cells respectively in the red, green, blue, and white sub-pixel regions.

In addition, the forming of the overcoat layer in the red and green sub-pixel regions except for the blue and white sub-pixel regions may include forming an organic layer over the entire surface of the substrate provided with the red, green, and blue color filters, forming an overcoat layer in the red, green, blue, and white sub-pixel regions by patterning the organic layer using a mask including a shielding unit corresponding to the red and green sub-pixel regions, a semi-transmissive unit corresponding to the blue and white sub-pixel regions, and a transmissive unit corresponding to a contact hole of the thin film transistor, and removing portions of the overcoat layer in the blue and white sub-pixel regions.

In another aspect of the present invention, a method of manufacturing an organic light emitting display panel includes forming a substrate having red, green, blue, and white sub-pixel regions, forming red, green, and blue color filters respectively in the red, green, and blue sub-pixel regions, forming an overcoat layer in the sub-pixel regions such that a thickness of the overcoat layer in the red and green sub-pixel regions is greater than a thickness of the overcoat layer in the blue and white sub-pixel regions, and forming organic emitting cells respectively in the red, green, blue, and white sub-pixel regions.

In addition, the forming of the overcoat layer in the sub-pixel regions such that a thickness of the overcoat layer in the red and green sub-pixel regions is greater than a thickness of the overcoat layer in the blue and white sub-pixel regions may include forming an organic insulating material over the entire surface of the substrate provided with the red, green, and blue color filters, and forming an overcoat layer by patterning the organic insulating material using a mask that includes a shielding unit corresponding to the red and green sub-pixel regions, a semi-transmissive unit corresponding to the blue and white sub-pixel regions, and a transmissive unit corresponding to a contact hole of the thin film transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
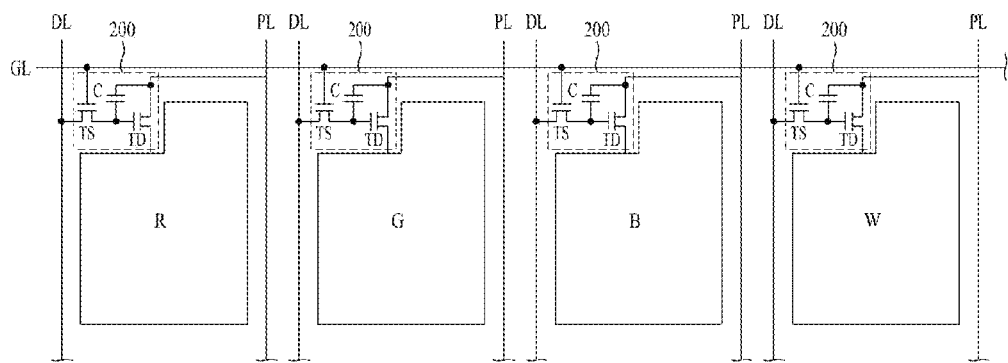
FIG. 1 is a plan view showing an organic light emitting display panel according to a first embodiment of the present invention.
Figure 2:
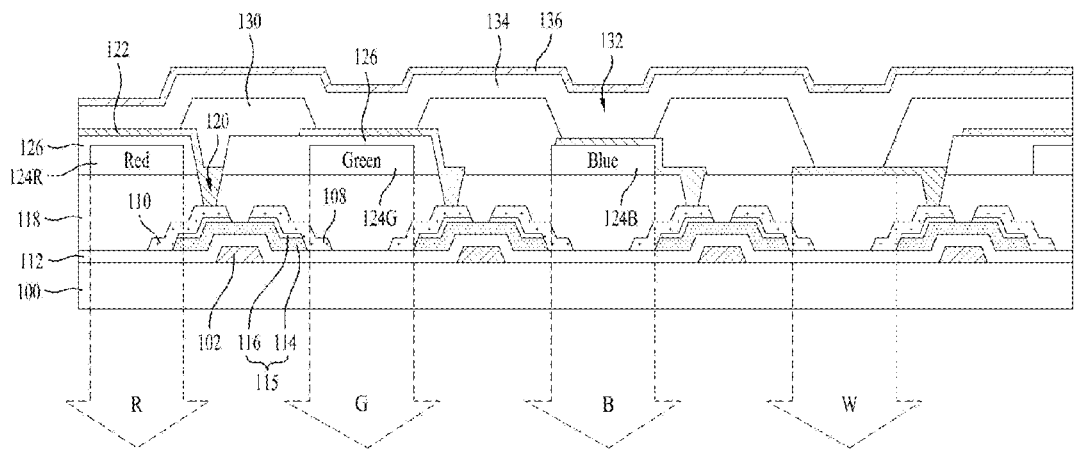
FIG. 2 is a cross-sectional view showing the organic light emitting display panel of FIG. 1.

FIG. 1 is an equivalent circuit diagram of R, G, and B sub-pixel regions according to the present invention, and FIG. 2 is a cross-sectional view of the organic light emitting display panel of FIG. 1 showing R, G, and B sub-pixel regions.

Referring to FIGS. 1 and 2, an organic light emitting display panel according to an embodiment of the present invention includes a plurality of sub-pixel regions formed at respective intersections of gate lines GL, data lines DL, and power lines PL.

The plurality of sub-pixel regions include R sub-pixel regions, G sub-pixel regions, B sub-pixel regions, and W sub-pixel regions which are arranged in a matrix form to display an image.

Each of the R, G, B, and W sub-pixel regions includes a cell driving unit 200 and an organic light emitting cell connected to the cell driving unit 200.

The cell driving unit 200 includes a switch thin film transistor TS connected to the gate line GL and the data line DL, a driving thin film transistor TD connected to the switch thin film transistor TS and between the power line PL and a first electrode 122 of the organic light emitting cell, and a storage capacitor C connected between the power line PL and a drain electrode of the switch thin film transistor TS.

The switch thin film transistor TS includes a gate electrode connected to the corresponding gate line GL, a source electrode connected to the corresponding data line DL, and the drain electrode connected to a gate electrode of the driving thin film transistor TD and the storage capacitor C. The driving thin film transistor TD includes a source electrode connected to the corresponding power line PL and a drain electrode 110 connected to the first electrode 122. The storage capacitor C is connected between the corresponding power line PL and the gate electrode of the driving thin film transistor TD.

When a scan pulse is supplied to the gate line GL, the switch thin film transistor TS is turned on to provide a data signal supplied to the data line DL to the storage capacitor C and the gate electrode of the driving thin film transistor TD. The driving thin film transistor TD controls current I supplied from the power line PL to the organic light emitting cell device in response to the data signal supplied to the gate electrode, thereby regulating light intensity of the organic light emitting cell. In addition, even when the switch thin film transistor TS is turned off, the driving thin film transistor TD supplies a constant current I by a voltage charged in the storage capacitor C until a data signal of a subsequent frame is supplied thereto, so that emission of the organic light emitting cell is sustained.

As shown in FIG. 2, the driving thin film transistor TD includes a gate electrode 102 formed on a substrate 100, the drain electrode 110 connected to the first electrode 122 of the organic light emitting cell, a source electrode 108 opposite the drain electrode 110, an active layer 114 formed to overlap the gate electrode 102 to form a channel between the source electrode 108 and the drain electrode 110 via a gate insulating layer 112 interposed between the active layer 114 and the gate electrode 102, and an ohmic contact layer 116 formed on the active layer 114 except for the channel region for an ohmic contact with the source electrode 108 and the drain electrode 110. In addition, an organic protection layer 118 is formed of an organic insulating material over the driving thin film transistor TD to planarize the substrate 100 provided with the driving thin film transistor TD. Alternatively, a double-layered protection layer including an inorganic protection layer formed of an inorganic insulating material and an organic protection layer formed of an organic insulating material may be formed over the driving thin film transistor TD.

The organic light emitting cell includes the first electrode 122 connected to the drain electrode 110 of the driving thin film transistor TD, a bank insulating layer 130 having a bank hole 132 exposing the first electrode 122, an organic common layer 134 formed on the first electrode 122, and a second electrode 136 formed on the organic common layer 134.

The first electrode 122, as an anode, is a transparent conductive electrode formed of a transparent conductive oxide (TCO), indium tin oxide (ITO), or indium zinc oxide (IZO). In addition, the second electrode 136, as a cathode, is formed of a reflective metallic material such as aluminum (Al). As shown in FIG. 2, a bottom emission is implemented according to the present invention. However, bottom emission, top emission, and double-sided emission may also be implemented according to materials used to form the first and second electrodes 122 and 136.

The organic common layer 134 has a structure in which a hole injection layer (HIL), a hole transport layer (HTL), an emitting layer (EML), an electron transport layer (ETL), and an electron injection layer (EIL) are sequentially stacked on the first electrode 122.

In the organic light emitting cell, when a voltage is applied between the first electrode 122 and the second electrode 136, holes from the first electrode 122 and electrons from the second electrode 136 are injected into the EML and recombined in the EML to generate excitons. When the excitons drop to a ground state, light is emitted toward the bottom side.

An R color filter 124R is formed on the protection layer 118 in the R sub-pixel region to emit red light R. A G color filter 124G is formed on the protection layer 118 in the G sub-pixel region to emit green light G. A B color filter 124B is formed on the protection layer 118 in the B sub-pixel region to emit blue light B. No color filter is formed on the protection layer 118 in the W sub-pixel region to emit white light W.

Meanwhile, according to the present invention, an overcoat layer 126 is formed on the R color filter 124R and the G color filter 124G in the R and G sub-pixel regions for planarization, but the overcoat layer 126 is not formed in the B and W sub-pixel regions in order to improve efficiency of the panel. Specifically, this will be described with reference to Tables 1 and 2.

Table 1 shows a comparative example where the overcoat layer 126 is formed on the R, G, B, and W sub-pixel regions, and Table 2 shows an example according to the present invention where the overcoat layer 126 is formed in the R and G sub-pixel regions but is not formed in the B and W sub-pixel regions.

TABLE 1

|  |  | Efficiency (Cd/A) | x | y | Current density (mA/cm2) | Panel efficiency |
|---|---|---|---|---|---|---|
| Comparative example | R | 7.18 | 0.658 | 0.331 | 0.60 | 28.2 |
|  | G | 29.98 | 0.307 | 0.627 | 0.88 |  |
|  | B | 2.87 | 0.146 | 0.051 | 1.78 |  |
|  | W | 74.88 | 0.331 | 0.344 | 1.21 |  |

TABLE 2

|  |  | Efficiency (Cd/A) | x | y | Current density (mA/cm2) | Panel efficiency |
|---|---|---|---|---|---|---|
| Example | R | 7.18 | 0.658 | 0.331 | 0.69 | 31.8 |
|  | G | 29.98 | 0.307 | 0.627 | 1.01 |  |
|  | B | 3.33 | 0.146 | 0.047 | 1.14 |  |
|  | W | 77.00 | 0.316 | 0.318 | 1.13 |  |

As shown in Tables 1 and 2, while the efficiency of the B sub-pixel region of the comparative example was 2.87%, the efficiency of the B sub-pixel region of the present invention was 3.33% which was increased by about 16.0%. While the efficiency of the W sub-pixel region of the comparative example was 74.8%, the efficiency of the W sub-pixel of the present invention was 77.00% which was increased by about 2.8%. Accordingly, while the panel efficiency of the comparative example was 28.2%, the panel efficiency of the present invention was 31.8% which was increased by about 12.8%.

Figure 3:
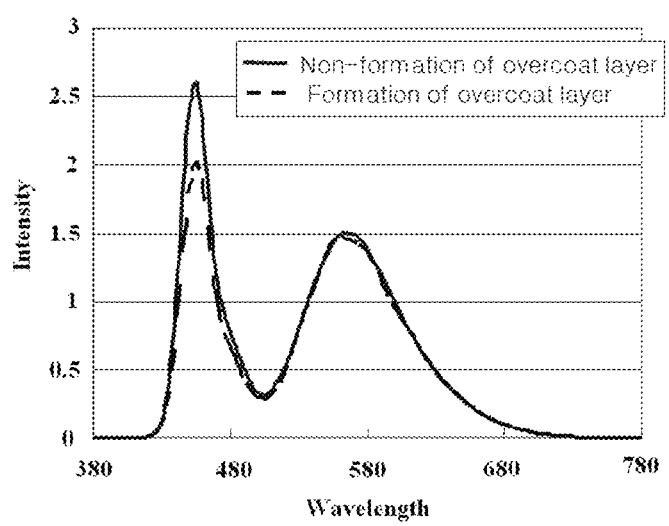
FIG. 3 is a graph showing results of white spectrum based on the formation of the overcoat layer in B and W sub-pixels of the organic light emitting display panel of FIG. 2.

In addition, as shown in Tables 1 and 2, while the current density of the B sub-pixel region of the comparative example was 1.78 mA/cm$^2$, the current density of the B sub-pixel region of the present invention was about 1.1 mA/cm$^2$ which was reduced by about 64%. While the current density of the W sub-pixel region of the comparative example was 1.21 mA/cm$^2$, the current density of the W sub-pixel of the present invention was about 1.13 mA/cm$^2$ which was reduced by about 93%. Accordingly, since the current density according to the present invention is reduced to average about 89% that of the comparative example, the lifespan of the B sub-pixel is increased to 2.04 times longer than that of the comparative example, and the lifespan of the W sub-pixel is increased to 1.12 times longer than that of the comparative example. In this regard, as the lifespan of the B sub-pixel that generally has the shortest lifespan is increased, the lifespan of the entire panel is increased. As the current density of the W sub-pixel is reduced as shown in Tables 1 and 2 and FIG. 3, the lifespan of the entire panel is increased.

As such, since the overcoat layer 126 reducing transmittance is not formed in the B and W sub-pixel regions according to the present invention, the panel efficiency is improved. In addition, as the current density is reduced, the lifespan of the panel is increased.

Meanwhile, although the present invention is described with reference to an example of removing the overcoat layer 126 in the B and W sub-pixel regions, the same effect may be obtained by removing the overcoat layer in the R, G, B, and W sub-pixels.

FIGS. 4A to 4H are cross-sectional views for description of a method of manufacturing the organic light emitting display panel of FIG. 2 according to another embodiment of the present invention.

Figure 4A:
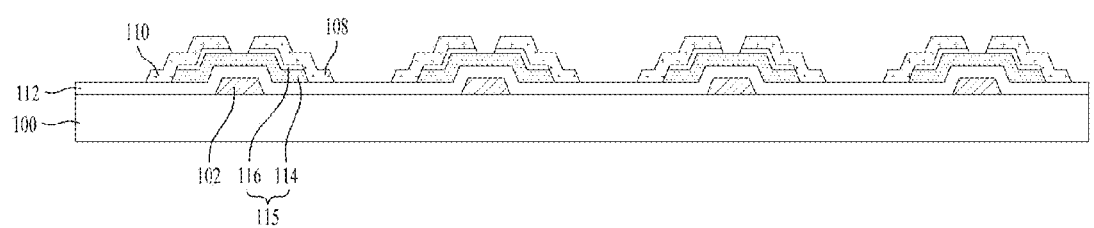
FIGS. 4A to 4H are cross-sectional views for description of a method of manufacturing the organic light emitting display panel of FIG. 2.

Referring to FIG. 4A, a driving thin film transistor including a gate electrode 102, a gate insulating layer 112, a semiconductor pattern 115, a source electrode 108, and a drain electrode 110 is formed on a substrate 100.

Particularly, a gate metal layer is formed over the substrate 100 by deposition such as sputtering. The gate metal layer may be formed of a metallic material such as Mo, Ti, Cu, AlNd, Al, Cr, Mo alloy, Cu alloy, Al alloy, and Mo—Ti alloy. Then, the gate metal layer is patterned by photolithography and etching processes to form the gate electrode 102.

Then, an inorganic insulating material such as silicon oxide (SiO$_x$) or silicon nitride (SiN$_x$) is formed over the entire surface of the substrate 100 provided with the gate electrode 102 to form the gate insulating layer 112. Then, an amorphous silicon layer and an amorphous silicon layer doped with impurities (n$^+$ or p$^+$) are sequentially formed on the substrate 100 provided with the gate insulating layer 112. Then, the amorphous silicon layer and the amorphous silicon layer doped with impurities (n$^+$ or p$^+$) are patterned by photolithography and etching processes to form the semiconductor pattern 115 including the active layer 114 and the ohmic contact layer 116.

Then, a data metal layer is formed over the substrate 100 provided with the semiconductor pattern 115 by deposition such as sputtering. In this regard, the data metal layer is formed of titanium (Ti), tungsten (W), aluminum (Al)-based metal, molybdenum (Mo), copper (Cu), and the like. Then, the data metal layer is patterned by photolithography and etching processes to form the source electrode 108 and the drain electrode 110. Then, the ohmic contact layer 116 disposed between the source electrode 108 and the drain electrode 110 is removed by using the source electrode 108 and the drain electrode 110 as masks to expose the active layer 114.

As described above, the semiconductor pattern 115, and the source and drain electrodes 108 and 110 are separately formed, and thus two masks are required to form the semiconductor pattern 115 and the source and drain electrodes 108 and 110. In order to reduce the number of masks, the semiconductor pattern 115, and the source and drain electrodes 108 and 110 may be simultaneously formed by a single mask process using a slit mask or semi-transmissive mask.

Figure 4B:
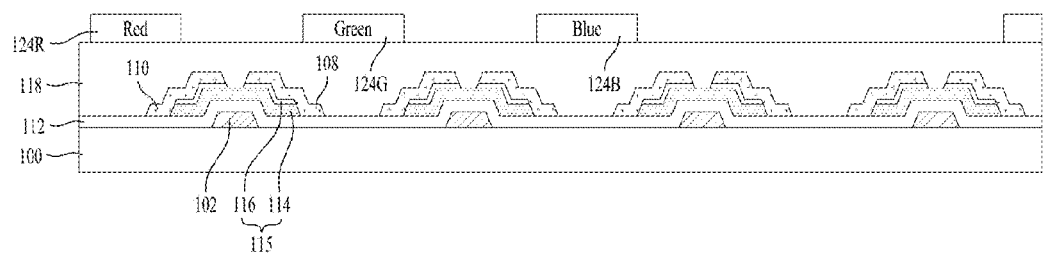

Referring to FIG. 4B, the organic protection layer 118 is formed on the substrate 100 provided with the source and drain electrodes 108 and 110, and the R, G, and B color filters 124R, 124G, and 124B are respectively formed in each of the sub-pixel regions.

Particularly, an organic insulating material such as acrylic resin is formed over the entire surface of the substrate 100 provided with the source and drain electrodes 108 and 110 to form the organic protection layer 118. Then, a red R colored resist is coated on the organic protection layer 118 and processed by photolithography and etched to form a red color filter 124R on the organic protection film 118 in the R sub-pixel region. Then, a green G colored resist is coated on the organic protection layer 118 and processed by using photolithography and etching to form a green color filter 124G on the organic protection film 118 in the G sub-pixel region. Then, a blue B colored resist is coated on the organic protection layer 118 and processed by photolithography and etching to form a blue color filter 124B on the organic protection film 118 in the B sub-pixel region. Accordingly, the R, G, and B color filters 124R, 124G, and 124B are formed in the R, G, and B sub-pixel regions, respectively.

Figure 4C:
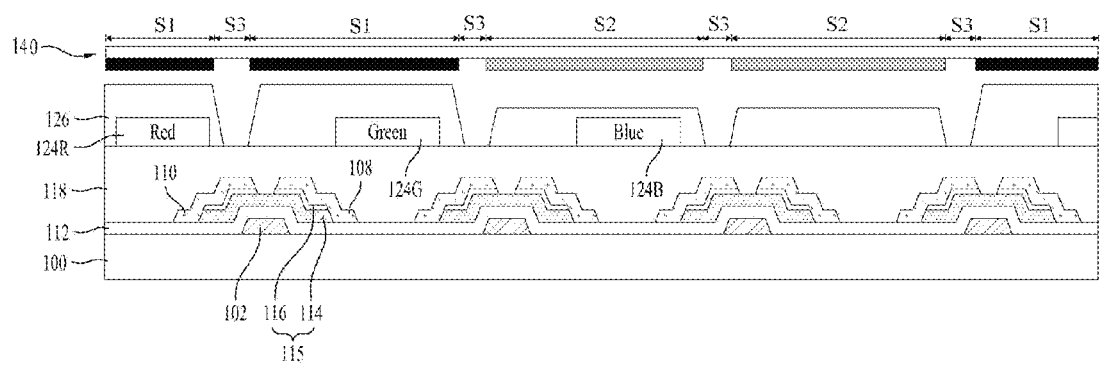

Referring to FIG. 4C, an overcoat layer 126 is formed over the substrate 100 provided with the R, G, and B color filters 124R, 124G, and 124B by photolithography using a slit mask or semi-transmissive mask.

Particularly, a photosensitive organic layer such as an acrylic resin layer is formed on the substrate 100 provided with the R, G, and B color filters 124R, 124G, and 124B. Then, the photosensitive organic layer is patterned by photolithography using a mask 140 having a shielding unit S1, a semi-transmissive unit S2, and a transmissive unit S3 to form the overcoat layer 126 such that the overcoat layer 126 has a first thickness in the B and W sub-pixel regions and a second thickness greater than the first thickness in the R and G sub-pixel regions. In this regard, the overcoat layer 126 in the R and G sub-pixel regions corresponds to the shielding unit S1 of the mask 140, and the overcoat layer 126 in the B and W sub-pixel regions corresponds to the semi-transmissive unit S2 of the mask 140.

Figure 4D:
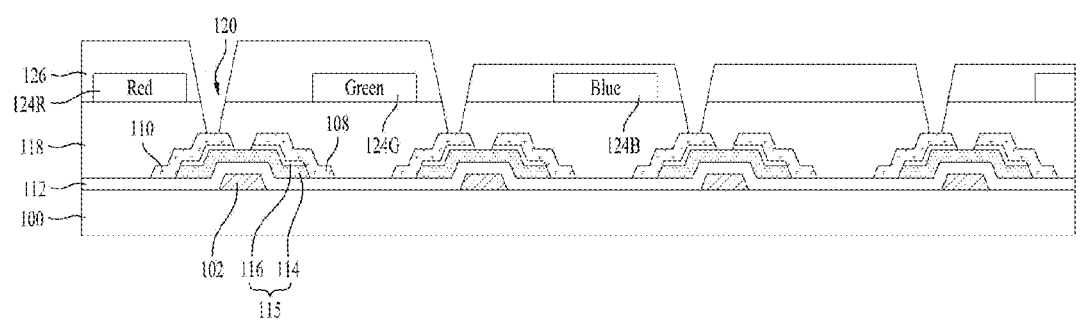

Referring to FIG. 4D, a pixel contact hole 120 is formed by etching using the overcoat layer 126 as the mask 140.

Particularly, the organic protection layer 118 that is exposed by the overcoat layer 126 and corresponds to the transmissive unit S3 of the mask 140 is patterned by etching using the overcoat layer 126 as a mask to form the pixel contact hole 120. Accordingly, the pixel contact hole 120 exposes the drain electrode 110 of the driving thin film transistor of each sub-pixel region.

Figure 4E:
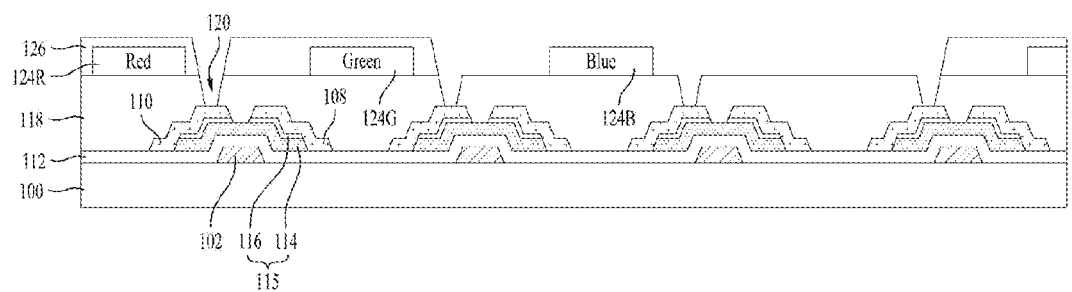

Referring to FIG. 4E, portions of the overcoat layer 126 in the B and W sub-pixel regions formed on the substrate 100 provided with the pixel contact hole 120 are selectively removed.

Particularly, the overcoat layer 126 formed on the substrate 100 provided with the pixel contact hole 120 is processed via an $O_2$ plasma ashing process. The portions of the overcoat layer 126, which are disposed in the B and W sub-pixel regions and have the first thickness, are removed, and the portions of the overcoat layer 126, which are disposed in the R and G sub-pixel regions and have the second thickness greater than the first thickness are thinned by the ashing process. Accordingly, the overcoat layer 126 is formed on the R and G sub-pixel regions except for the B and W sub-pixel regions.

Figure 4F:
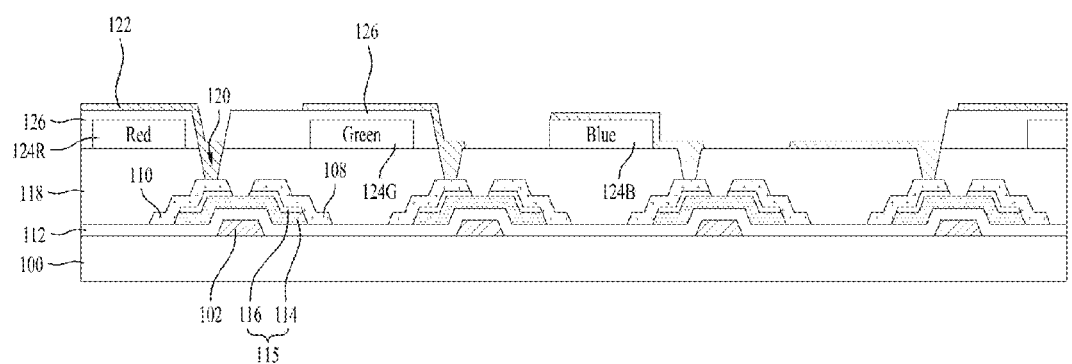

Referring to FIG. 4F, the first electrode 122 is formed on the substrate 100 provided with the overcoat layer 126.

Particularly, a transparent metallic material such as a transparent conductive oxide (TCO), indium tin oxide (ITO), or indium zinc oxide (IZO) is formed on the substrate 100 provided with the overcoat layer 126 by deposition such as sputtering. Then, the transparent metallic material is patterned by photolithography and etching processes to form the first electrode 122.

Figure 4G:
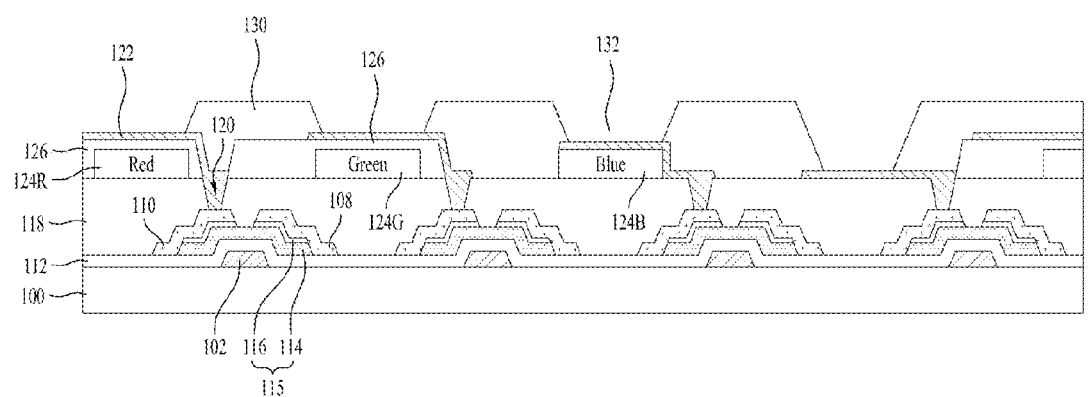

Referring to FIG. 4G, a bank insulating layer 130 having a bank hole 132 is formed on the substrate 100 provided with the first electrode 122.

Particularly, the bank insulating layer 130 formed of an organic insulating material such as photoacryl is coated over the entire surface of the substrate 100 provided with the first electrode 122. Then, the bank insulating layer 130 is patterned by photolithography and etching processes to form the bank insulating layer 130 having a bank hole 132 through which the first electrode 122 is exposed.

Figure 4H:
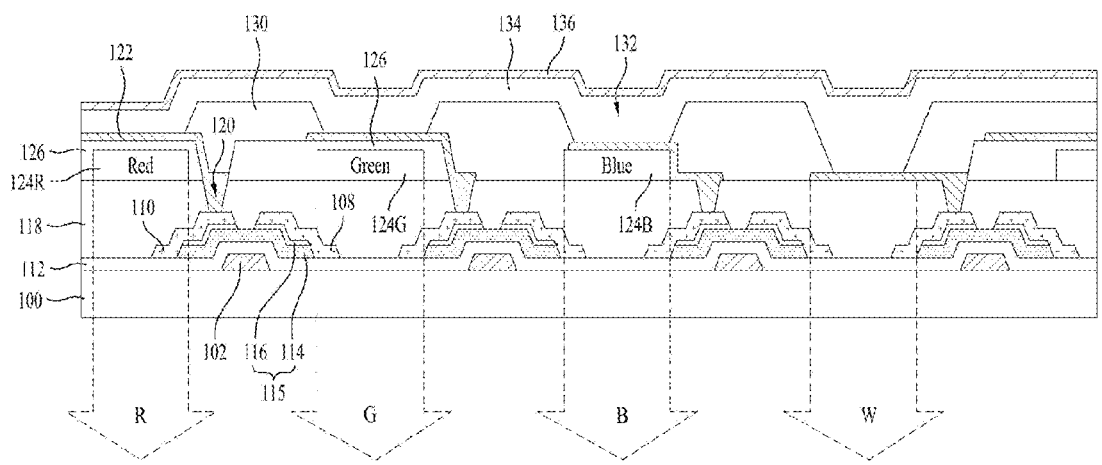

Referring to FIG. 4H, an organic common layer 134 is formed on the substrate 100 provided with the bank insulating layer 136, and a second electrode 136 is formed on the organic common layer 134.

Particularly, an organic common layer 134 including a hole injection layer (HIL), a hole transport layer (HTL), an emitting layer (EML), an electron transport layer (ETL), and an electron injection layer (EIL) is formed on the first electrode 122. Then, aluminum (Al) and silver (Ag) are deposited on the organic common layer 134 to form the second electrode 136.

Figure 5:
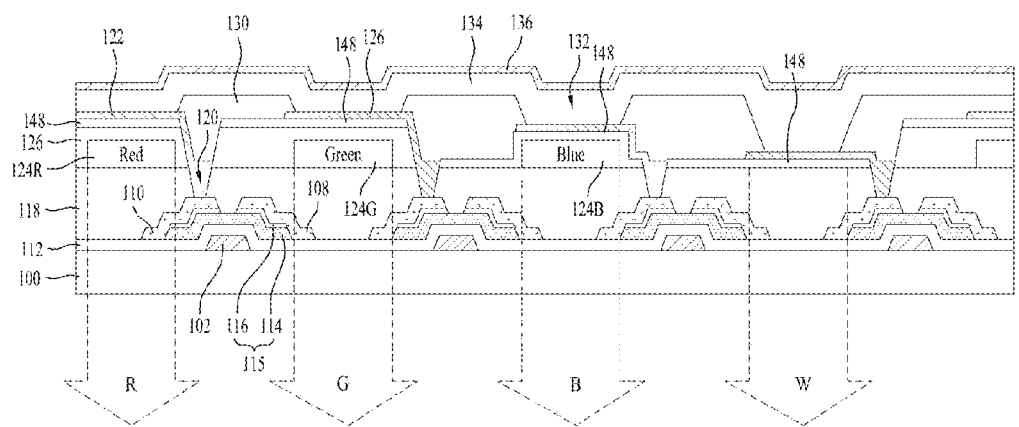
FIG. 5 is a cross-sectional view showing an organic light emitting display panel according to a second embodiment of the present invention.

FIG. 5 is a cross-sectional view of an organic light emitting display panel according to a second embodiment of the present invention.

As compared to the organic light emitting display panel shown in FIG. 2, the organic light emitting display panel shown in FIG. 5 includes the same constituent elements except that a buffer layer 148 is further formed. Thus, a detailed description of the same constituent elements will be omitted hereinafter.

If the overcoat layer 126 is not formed in the B and W sub-pixel regions, the buffer layer 148 is formed over the entire surface of the substrate 100 provided with the overcoat layer 126 in order to prevent the B color filter 124B from directly contacting the first electrode 122. That is, the buffer layer 148 is formed between the overcoat layer 126, which is formed in the R and G sub-pixel regions, and the first electrode 122 of the organic light emitting cell, between the B color filter 124B of the B sub-pixel region and the first electrode 122 of the organic light emitting cell, and between the protection layer 118 of the W sub-pixel region and the first electrode 122 of the organic light emitting cell. In this regard, the buffer layer 148 is formed of an inorganic insulating material such as $SiN_x$ or $SiO_x$ which does not influence transmittance due to being thinner than the overcoat layer 126.

Figure 6:
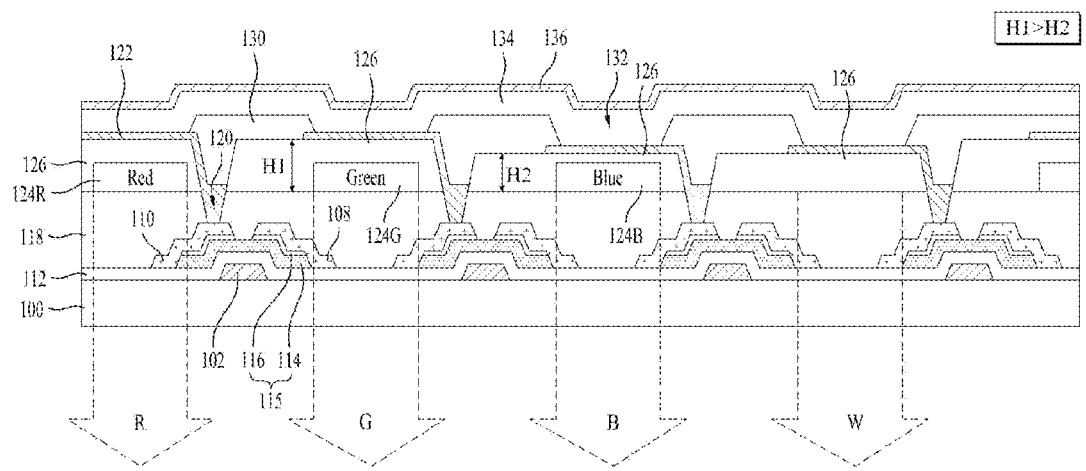
FIG. 6 is a cross-sectional view showing an organic light emitting display panel according to a third embodiment of the present invention.

FIG. 6 is a cross-sectional view of an organic light emitting display panel according to a third embodiment of the present invention.

As compared to the organic light emitting display panel shown in FIG. 2, the organic light emitting display panel shown in FIG. 6 includes the same constituent elements except that the overcoat layer 126 has different regional thicknesses. Thus, a detailed description of the same constituent elements will be omitted hereinafter.

In the overcoat layer 126 shown in FIG. 6, the thickness of overcoat layer 126 in the B and W sub-pixel regions is different from that in the R and G sub-pixel regions. That is, a thickness H2 of the overcoat layer 126 formed in the B and W sub-pixel regions is less than a thickness H1 of the overcoat layer 126 formed in the R and G sub-pixel regions. In this regard, since the thickness of the overcoat layer 126 reducing transmittance in the B sub-pixel region is relatively thin, decrease in efficiency of the B and W sub-pixel regions may be prevented.

As such, since the overcoat layer 126 formed in the B and W sub-pixel regions is thinner than the overcoat layer 126 formed in the R and G sub-pixel regions, panel efficiency is increased. In addition, as current density is reduced, the lifespan of the panel is increased.

The overcoat layer 126 of the organic light emitting display panel shown in FIG. 6 may be formed using the process illustrated with reference to FIGS. 4C and 4D in which the asking process illustrated in FIG. 4E is not performed.

The organic light emitting display panel according to the present invention may have improved efficiency and lifespan by forming the overcoat layer such that a thickness of the overcoat layer in B and W sub-pixel regions is less than that of the overcoat in the other sub-pixel regions or by selectively removing the overcoat layer in the B and W sub-pixel regions.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display panel comprising:
    a substrate having red, green, blue, and white sub-pixel regions;
    red, green, and blue color filters respectively disposed in the red, green, and blue sub-pixel regions;
    an overcoat layer disposed in at least two sub-pixel regions of the red, green, and blue sub-pixel regions; and
    organic emitting cells having a first electrode respectively disposed in the red, green, blue, and white sub-pixel regions,
    wherein a lower surface of the first electrode disposed in one sub-pixel region of the red, green, and blue sub-pixel regions is disposed on a plane different from lower surfaces of the first electrodes disposed in the other two sub-pixel regions of the red, green, and blue sub-pixel regions.

2. The organic light emitting display panel of claim 1, wherein:
    the organic emitting cells in the red and green sub-pixel regions are disposed on the overcoat layer;
    the organic emitting cell in the blue sub-pixel region is disposed on the blue color filter; and
    the organic emitting cell in the white sub-pixel region is disposed on a protection layer to cover a thin film transistor disposed on the substrate.

3. The organic light emitting display panel of claim 2, wherein the first electrode directly contacts the blue color filter and indirectly contacts the red and green color filters, the overcoat layer disposed between the first electrode and the red and green color filters.

4. The organic light emitting display panel of claim 1, further comprising a buffer layer disposed between the overcoat layer and each of the organic emitting cells in the red and green sub-pixel regions, between the blue color filter and the organic emitting cell in the blue sub-pixel region, and between the protection layer and the organic emitting cell in the white sub-pixel region,
    wherein the buffer layer is composed of an inorganic insulating material comprising $SiNX$ or $SiOx$.

5. The organic light emitting display panel of claim 1, wherein:
    a thickness of the overcoat layer in the at least one sub-pixel region of the red, green, and blue sub-pixel regions is different from a thickness of the overcoat layer in the other sub-pixel region of the red, green, and blue sub-pixel regions.

6. The organic light emitting display panel of claim 5, wherein:
    the overcoat layer in the red, green, and blue sub-pixel regions is disposed in the red, green, and blue color filters such that the thickness of the overcoat layer in the red and green sub-pixel regions is greater than the thickness of the overcoat layer in the blue and white sub-pixel regions; and
    the overcoat layer in the white sub-pixel region is disposed on a protection layer to cover a thin film transistor disposed on the substrate.

7. A method of manufacturing an organic light emitting display panel, the method comprising:
    forming a substrate having red, green, blue, and white sub-pixel regions;
    forming red, green, and blue color filters respectively in the red, green, and blue sub-pixel regions;
    forming an overcoat layer in at least two sub-pixel regions of the red, green, and blue sub-pixel regions; and
    forming organic emitting cells having a first electrode respectively in the red, green, blue, and white sub-pixel regions,
    wherein a lower surface of the first electrode disposed in the one sub-pixel region of the red, green, and blue sub-pixel regions is disposed on a plane different from lower surfaces of the first electrodes disposed in the other two sub-pixel regions of the red, green, and blue sub-pixel regions.

8. The method of claim 7, wherein:
    the organic emitting cells in the red and green sub-pixel regions are disposed on the overcoat layer;
    the organic emitting cell in the blue sub-pixel region is disposed on the blue color filter; and
    the organic emitting cell in the white sub-pixel region is disposed on a protection layer to cover a thin film transistor disposed on the substrate.

9. The method of claim 7, further comprising forming a buffer layer between the overcoat layer and each of the organic emitting cells in the red and green sub-pixel regions except for in the blue and white sub-pixel regions, between the blue color filter and the organic emitting cell in the blue sub-pixel region, and between the protection layer and the organic emitting cell in the white sub-pixel region,
  wherein the buffer layer is composed of an inorganic insulating material comprising SiNX or SiOx.

10. The method of claim 7, wherein the forming of the overcoat layer in the at least two sub-pixel regions of the red, green, and blue sub-pixel regions comprises:
  forming an organic layer over the entire surface of the substrate provided with the red, green, and blue color filters;
  forming the overcoat layer in the red, green, blue, and white sub-pixel regions by patterning the organic layer using a mask including a shielding unit corresponding to the red and green sub-pixel regions, a semi-transmissive unit corresponding to the blue and white sub-pixel regions, and a transmissive unit corresponding to a contact hole of the thin film transistor; and
  removing portions of the overcoat layer in the blue and white sub-pixel regions.

11. The method of claim 7, wherein a thickness of the overcoat layer in the at least one sub-pixel region of the red, green, and blue sub-pixel regions is different from than a thickness of the overcoat layer in the other sub-pixel region of the red, green, and blue sub-pixel regions.

12. The method of claim 11, wherein:
  the overcoat layer in the red, green, and blue sub-pixel regions are disposed on the red, green, and blue color filters such that the thickness of the overcoat layer in the red and green sub-pixel regions is greater than the thickness of the overcoat layer in the blue and white sub-pixel regions; and
  the overcoat layer in the white sub-pixel region is disposed on a protection layer to cover a thin film transistor disposed on the substrate.

13. The method of claim 11, wherein the forming the overcoat layer in the at least two sub-pixel regions of the red, green, and blue sub-pixel regions comprises:
  forming an organic insulating material over the entire surface of the substrate provided with the red, green, and blue color filters; and
  forming the overcoat layer by patterning the organic insulating material using a mask including a shielding unit corresponding to the red and green sub-pixel regions, a semi-transmissive unit corresponding to the blue and white sub-pixel regions, and a transmissive unit corresponding to a contact hole of the thin film transistor.

14. An organic light emitting display panel, comprising:
  a substrate having red, green, blue, and white sub-pixel regions;
  red, green, and blue color filters respectively disposed in the red, green, and blue sub-pixel regions;
  an overcoat layer disposed in at least two sub-pixel regions of the red, green, and blue sub-pixel regions; and
  organic emitting cells having a first electrode respectively disposed in the red, green, blue, and white sub-pixel regions,
  wherein a lower surface of the first electrode disposed in one sub-pixel region of the red, green, and blue sub-pixel regions is disposed on a plane different from lower surfaces of the first electrodes disposed in the other two sub-pixel regions of the red, green, and blue sub-pixel regions; and
  wherein:
  the organic emitting cells in the red and green sub-pixel regions are disposed on the overcoat layer;
  the organic emitting cell in the blue sub-pixel region is disposed on the blue color filter; and
  the organic emitting cell in the white sub-pixel region is disposed on a protection layer to cover a thin film transistor disposed on the substrate.

15. The organic light emitting display of claim 1, wherein the overcoat layer is not disposed in the white sub-pixel regions.

16. The method of claim 7, wherein the overcoat layer is not disposed in the white sub-pixel regions.

* * * * *